US012738950B1

(12) United States Patent
Seok et al.

(10) Patent No.: US 12,738,950 B1
(45) Date of Patent: Sep. 15, 2026

(54) ADC OFFSET DAC GLITCH SUPPRESSION

(71) Applicant: Cadence Design Systems, Inc., San Jose, CA (US)

(72) Inventors: Chunkyun Seok, Cary, NC (US); Christopher George Moscone, Cary, NC (US); Mark A. Summers, Cary, NC (US)

(73) Assignee: Cadence Design Systems, Inc., San Jose, CA (US)

(*) Notice: Subject to any disclaimer, the term of this patent is extended or adjusted under 35 U.S.C. 154(b) by 139 days.

(21) Appl. No.: 18/946,701

(22) Filed: Nov. 13, 2024

(51) Int. Cl.
*H03M 1/10* (2006.01)
*H03M 1/06* (2006.01)

(52) U.S. Cl.
CPC .................................. *H03M 1/0607* (2013.01)

(58) Field of Classification Search
CPC .. H03M 1/1023; H03M 1/462; H03M 1/1245; H03M 1/747; H03M 1/0607; H03M 1/0863; H03M 1/46; H03M 1/466; H03M 1/468; H03M 1/745; H03M 1/00; H03M 1/002; H03M 1/0604; H03M 1/0612; H03M 1/0624; H03M 1/068; H03M 1/069; H03M 1/0809; H03M 1/0836; H03M 1/1014; H03M 1/1028; H03M 1/1033; H03M 1/1047; H03M 1/1057; H03M 1/1061; H03M 1/1215; H03M 1/124; H03M 1/125; H03M 1/14; H03M 1/164; H03M 1/168; H03M 1/361; H03M 1/50; H03M 1/502; H03M 1/66; H03M 1/742; H03M 3/38; H03M 3/43; H03M 3/464
USPC ......................... 341/118–121, 143, 144, 155
See application file for complete search history.

(56) References Cited

U.S. PATENT DOCUMENTS

| | | | | |
|---|---|---|---|---|
| 7,688,237 | B2 * | 3/2010 | Cao | H03M 1/1061 341/120 |
| 8,330,632 | B2 * | 12/2012 | Bashirullah | H03M 1/1061 341/120 |
| 8,536,899 | B1 * | 9/2013 | Lu | H03M 1/1061 327/51 |
| 9,397,680 | B2 * | 7/2016 | Xu | H03M 1/1061 |
| 9,548,752 | B1 * | 1/2017 | Shrivastava | H03M 1/66 |
| 9,571,115 | B1 * | 2/2017 | Beukema | H03M 1/1023 |
| 2013/0106630 | A1 * | 5/2013 | Wong | H03M 1/46 341/110 |
| 2018/0358883 | A1 * | 12/2018 | Saputra | H03M 1/1047 |

(Continued)

*Primary Examiner* — Linh V Nguyen

(74) *Attorney, Agent, or Firm* — Schwegman Lundberg & Woessner, P.A.

(57) ABSTRACT

An analog-to-digital converter (ADC) circuit includes a digital calibration finite state machine to perform an offset calibration process during mission mode by iteratively adjusting bias currents within source follower buffers of the ADC circuit to compensate for offset errors. The ADC circuit also includes a current steering digital-to-analog converter (DAC) with a single-ended unit current cell that has an independently controllable positive switch and negative switch. The unit current cell receives a strobe signal used to update a calibration code of the offset calibration process. In response to transitioning from an off state to an on state, the unit current cell uses a precharge signal based on the strobe signal to precharge its tail node before turning on its positive switch, thereby suppressing glitches caused by transients in the bias currents.

20 Claims, 13 Drawing Sheets

(56) References Cited

U.S. PATENT DOCUMENTS

| | | | | |
|---|---|---|---|---|
| 2023/0283286 | A1* | 9/2023 | Wen | H03M 1/462 341/122 |
| 2024/0333300 | A1* | 10/2024 | Meng | H03M 1/0607 |
| 2025/0112641 | A1* | 4/2025 | Calabro | H03M 1/466 |

* cited by examiner 1004
118
1006
406
1008
312
1010
1002

ADC OFFSET DAC GLITCH SUPPRESSION

TECHNICAL FIELD

The present disclosures relate to analog-to-digital converters (ADCs) and, in some examples, to ADCs configured to suppress glitches during offset calibration in high-speed serializer/deserializer (SerDes) systems.

BACKGROUND

High-speed serializer/deserializer (SerDes) systems are widely used in data communication and networking applications to provide high data rates in modern communication interfaces. These systems often employ Pulse Amplitude Modulation with 4 levels (PAM4) signaling to achieve increased data rates. To process the analog signals in these high-speed systems, fast, medium-resolution analog-to-digital converters (ADCs) are required. Successive Approximation Register (SAR) ADCs are commonly used in SerDes systems due to their ability to provide a good balance between speed, resolution, and power consumption.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
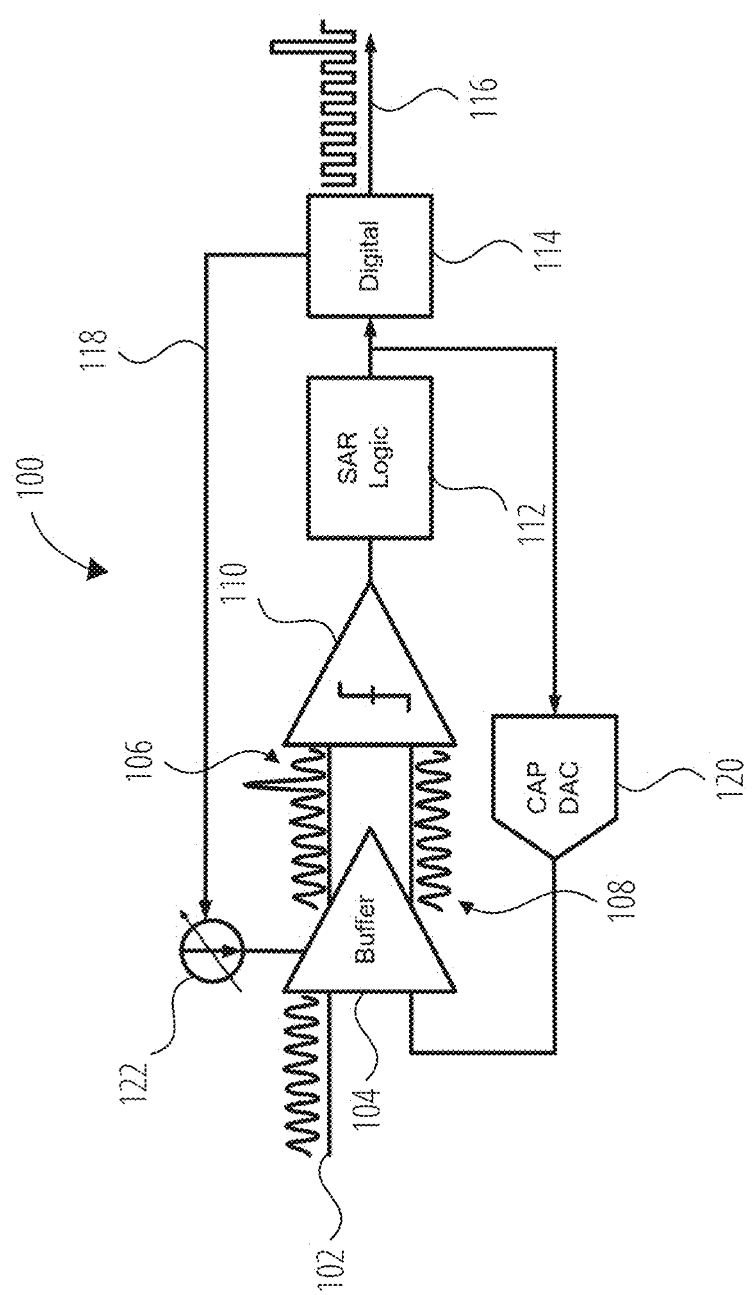
FIG. 1 is a block diagram illustrating an analog-to-digital converter (ADC) circuit, according to some examples.

Examples described herein relate to techniques for suppressing glitches during offset calibration in high-speed analog-to-digital converters (ADCs) used in serializer/deserializer (SerDes) systems. These techniques can be used to address challenges associated with maintaining signal integrity while performing background offset calibration in time-interleaved ADC systems.

While the use of SAR ADCs in SerDes systems can provide various advantages, it can also introduce certain design challenges. In some SerDes designs, multiple SAR ADCs are interleaved to further increase the effective sampling rate. This time-interleaving technique has the potential to introduce channel mismatches between the ADCs, including gain, offset, and timing mismatches. These mismatches, particularly offset errors, can manifest as distortion in the final output and degrade overall system performance.

Thus, offset errors are particularly critical to remove because they can manifest as spurious tones or artifacts when data from multiple ADC channels is combined. While offset calibration can be performed during startup or when the system is idle, there are cases where calibration needs to be performed during mission mode, i.e., while the system is operating.

Some examples described herein focus on a specific architecture for SAR ADCs used in high-speed SerDes systems. This architecture includes a source follower buffer before the comparator, with a bias current at the bottom. By adjusting this bias current through the buffers, offset compensation can be achieved.

One component of this architecture is a current steering digital-to-analog converter (DAC) used for offset calibration. In some examples, a single-ended architecture is employed for the unit current cell in the offset DAC. This differs from conventional differential architectures, and can offer advantages in terms of maintaining buffer bandwidth.

However, the single-ended architecture described herein can introduces an additional challenge: when a unit cell transitions from the off state to the on state, the tail node of the current steering DAC must charge. This abrupt charging process can lead to large transients in the buffer bias currents, potentially causing glitches in the signal path.

To address this issue, some examples described herein introduce a technique for pre-charging the tail node of the current steering DAC. This pre-charging occurs before the positive switch is turned on, reducing the magnitude of the glitch that occurs during the transition.

The pre-charge signal is generated by leveraging an existing strobe signal used to update the calibration code. This approach may eliminate the need for additional control signals, potentially reducing complexity and/or power consumption.

In some examples, the pre-charge control logic is implemented using two latches. These latches define the previous state and the current state of the calibration process. The pre-charge signal is generated only when the previous state is off and the current state becomes on.

The expected effectiveness of this glitch suppression technique is consistent with results observed in simulations. In the worst-case scenario, where the calibration update occurs during the Most Significant Bit (MSB) conversion of the SAR ADC, the magnitude of the glitch is significantly reduced compared to the case without glitch suppression.

It will be appreciated that the examples described herein are described in the context of SAR ADCs used in high-speed SerDes systems. The described techniques may be particularly useful when background offset calibration is required during mission mode operation.

The single-ended architecture of the offset DAC, alone or combined with the pre-charge technique, may offer one or more of the following advantages:

1. Preservation of buffer bandwidth: Unlike differential architectures, the single-ended architecture can be configured to not reduce the bias current of the buffer, maintaining its bandwidth.
2. Minimal impact on signal integrity: Glitches are suppressed during background offset calibration, thereby reducing or minimizing disturbance to the receiver system.
3. Efficient power consumption: The pre-charging can be timed to occur only for a short period during the calibration process, reducing additional power consumption.
4. Reuse of existing signals: By leveraging the strobe signal to also perform pre-charge control, no additional control signals are required.

In some examples, the switches in the current steering DAC can be operated in the saturation region rather than as hard switches. This approach can potentially further reduce glitches by ensuring that the tail voltage remains constant regardless of the drain voltage of the switches.

In some examples, the techniques described herein address a specific challenge in high-speed SerDes systems: the need for background offset calibration without introducing significant glitches or artifacts in the received data. By employing a single-ended offset DAC architecture with a pre-charge technique, these examples may provide a solution that maintains signal integrity, preserves buffer bandwidth, and minimizes power consumption. Examples described herein may be of particular value in high-speed SerDes systems where maintaining signal integrity is crucial, and where offset drift over time needs to be addressed without stopping the system for recalibration. By enabling background calibration with minimal disturbance to the signal path, these techniques can help improve the overall performance and reliability of high-speed data communication systems.

FIG. 1 is a block diagram illustrating an analog-to-digital converter (ADC) circuit, also referred to herein as an ADC 100. The ADC 100 shown in FIG. 1 is a simplified representation showing functional blocks and their inputs and outputs.

The ADC 100 receives an input signal 102, which may be an analog signal to be converted to a digital representation. The input signal 102 is fed into a buffer 104, which may be implemented as a source follower buffer. The buffer 104 serves to isolate the input signal 102 from subsequent stages and may provide impedance matching or level shifting as needed. In some examples, the buffer 104 is implemented by a plurality of parallel buffers.

The buffer 104 generates two outputs: a first buffer output 106 and a second buffer output 108. These outputs may represent differential signals derived from the input signal 102. In some examples, the buffer 104 may be configured to adjust its bias currents to compensate for offset errors in the ADC 100.

The first buffer output 106 and the second buffer output 108 are connected to the inputs of a comparator 110. The comparator 110 compares the two buffer outputs 106 and 108 and generates a digital output based on their relative magnitudes. This digital output is then fed into the SAR logic 112.

The SAR logic 112 implements a successive approximation algorithm, which is used for the operation of a SAR ADC. The SAR logic 112 may be implemented as a finite state machine (FSM) that controls the analog to digital conversion process and generates digital codes based on the output of the comparator 110. In some examples, the SAR logic 112 may also include functionality for performing offset calibration during mission mode by iteratively adjusting the bias currents within the buffer 104. Such an FSM may be referred to as a digital calibration finite state machine.

The digital block 114 interfaces with the SAR logic 112 and may perform various digital processing tasks, such as data formatting or interfacing with external digital systems. The output of the digital block 114 is the final digital output signal 116, which represents the digitized version of the input signal 102.

A CAP DAC 120 (capacitive digital-to-analog converter) is connected to the comparator 110 and the SAR logic 112. In some examples, the CAP DAC 120 receives the output of the SAR logic 112. The CAP DAC 120 generates reference voltages for use by the comparator 110 based on the digital codes produced by the SAR logic 112 during the successive approximation process. In some examples, the output of the CAP DAC 120 is provided as an input to the buffer 104.

The current steering offset DAC 122 is used in the example offset calibration processes described herein. In some examples, the current steering offset DAC 122 includes one or more single-ended unit current cells with independently controllable positive and negative switches. An example implementation of the current steering offset DAC 122 is described in greater detail below with reference to FIG. 6. In the illustrated example, the current steering offset DAC 122 receives control signals, shown as an offset calibration code 118, from the digital block 114 and generates calibration currents that are injected into the buffer 104 to compensate for offset errors.

In some examples, sudden changes in bias currents within the source follower buffers (e.g., buffer 104) during the offset calibration process of the ADC 100 can result in glitches in the analog first buffer output 106. These glitches can then propagate through the system to the output signal 116: the first buffer output 106 feeds into the comparator 110, which compares it with a reference voltage generated by the CAP DAC 120. If a glitch occurs in the first buffer output 106, it will cause a momentary deviation in the input to the comparator 110. This deviation can lead to an incorrect comparison result, especially if it occurs during a critical sampling moment.

The comparator 110 output is then processed by the SAR logic 112, which uses this information to determine the next step in the successive approximation process. An incorrect comparison result due to the glitch can cause the SAR logic 112 to make an erroneous decision in its binary search algorithm.

This error in the decision of the SAR logic 112 propagates through the digital block 114, which performs various digital processing tasks on the converted signal. The digital block 114 may not be able to distinguish between a valid signal change and a glitch-induced error.

Consequently, the glitch-induced error becomes part of the final digital output signal 116, manifesting as an incorrect digital code or a sudden, unintended change in the digital representation of the analog input.

This propagation of glitches from the analog domain to the digital output underscores the importance of the example glitch suppression techniques described herein and implemented in the current steering offset DAC 122, which aims to minimize such disturbances during the offset calibration process.

In some examples, the ADC 100 may operate in various modes, including a mission mode during which data signals are processed (as input signals 102) to generate digital data (e.g., output signal 116). In some examples, offset calibration can be performed in the background without affecting signal integrity. The offset calibration process may be triggered in response to detecting temperature changes in the ADC 100, allowing for recalibration to dynamically compensate for offset drift over time.

Figure 2:
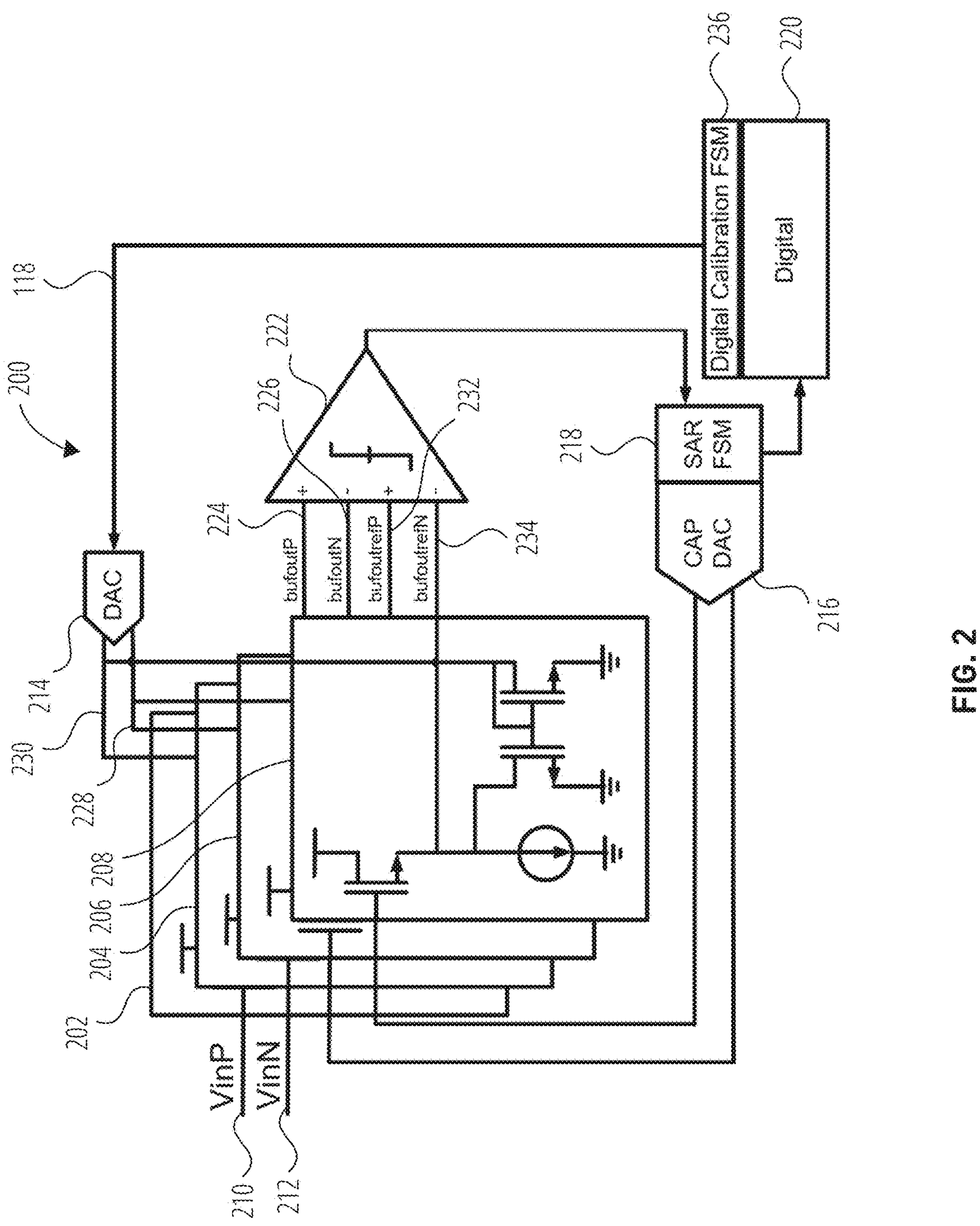
FIG. 2 is a block diagram illustrating a detailed architecture of an ADC circuit with a current steering DAC, according to some examples.

FIG. 2 is a block diagram illustrating a detailed architecture of an ADC circuit (also referred to as ADC 200) with a current steering DAC 214. The ADC 200 receives a positive input voltage 210 and a negative input voltage 212, which may represent a differential analog input signal (e.g., input signal 102 from FIG. 1) to be converted to a digital representation. These input voltages are fed into a first buffer 202 and a second buffer 204, respectively. In some examples, the buffers 202 and 204 are implemented as source follower buffers to provide impedance matching and isolation between the input stage and subsequent stages of the ADC 200.

The first buffer 202 and the second buffer 204 generate the positive buffer output signal 224 and the negative buffer output signal 226, respectively. These signals are connected to the inputs of the comparator 222. The comparator 222 compares the two buffer output signals 224 and 226 and generates a digital output based on their relative magnitudes.

The third buffer 206 and the fourth buffer 208 generate the positive buffer output reference 232 and the negative buffer output reference 234, respectively. These reference signals (232 and 234) may be used by the comparator 222 to establish a comparison threshold or to provide a common-mode reference for the differential input signals (224 and 226).

The current steering DAC 214 is connected to the buffers 202, 204, 206, and 208. A negative calibration signal 228 is propagated from the current steering DAC 214 to the second buffer 204, and a positive calibration signal 230 is propagated from the current steering DAC 214 to the third buffer 206. The current steering DAC 214 may include single-ended unit current cells with independently controllable positive and negative switches, as described in greater detail below with reference to the examples of FIG. 4 and FIG. 6. The current steering DAC 214 receives the offset calibration code 118 from a digital calibration FSM 236 (part of the digital block 220) and generates calibration currents that are injected into the buffers 202, 204, 206, and 208 to compensate for offset errors.

The CAP DAC 216 (capacitive digital-to-analog converter) is connected to the comparator 222 via the SAR FSM 218. The CAP DAC 216 generates reference voltages for the comparator 222 based on the digital codes produced by the SAR FSM 218 during the successive approximation process.

As an example implementation of the SAR logic 112 of FIG. 1, the digital calibration FSM 236 implements the successive approximation algorithm. In some examples, the digital calibration FSM 236 may also include functionality for performing offset calibration during mission mode by iteratively adjusting the bias currents within the buffers 202, 204, 206, and 208, as described below with reference to FIG. 3.

The digital block 220 interfaces with the SAR FSM 218 and the digital calibration FSM 236 and may perform various digital processing tasks, such as error correction, data formatting, or interfacing with external digital systems. The output of the digital block 220 represents the final digitized version of the input voltages 210 and 212.

The architecture of the ADC 200 can enable high-speed operation while maintaining signal integrity during background calibration. The use of multiple buffers and the current steering DAC 214 can enable precise offset compensation, which may provide benefits in time-interleaved ADC systems used in high-speed SerDes applications.

Figure 3:
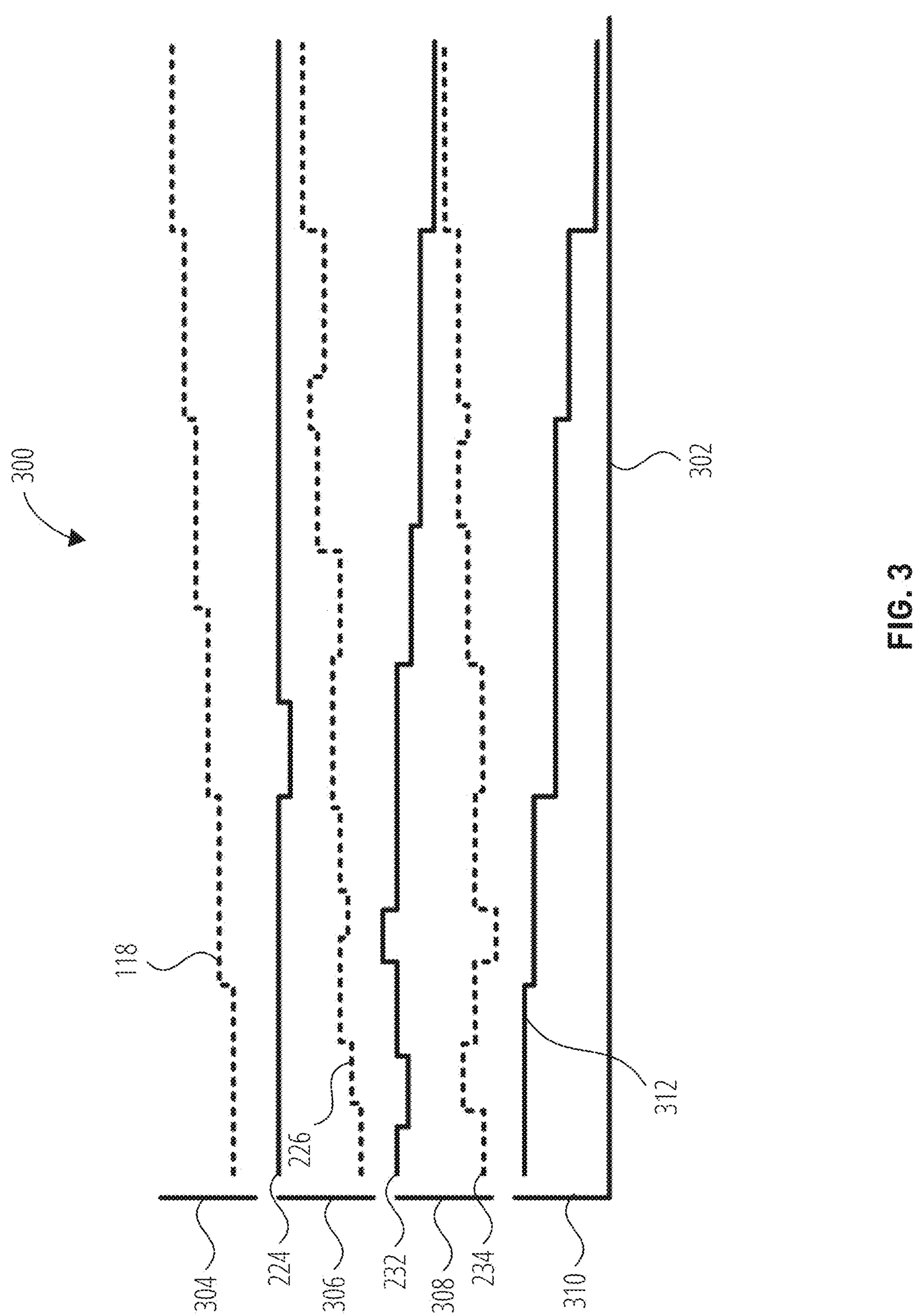
FIG. 3 is a graph illustrating waveforms during an offset calibration process in an ADC circuit, according to some examples.

FIG. 3 is a graph illustrating a time course 300 showing various signal waveforms during an offset calibration process in an ADC circuit, such as ADC 200 in FIG. 2. The time course 300 represents the progression of various signals and codes during the offset calibration process of a Successive Approximation Register (SAR) Analog-to-Digital Converter (ADC). The horizontal axis represents time 302, while the vertical axes represent either voltage (306 and 308) or digital codes (304 and 310). In the illustrated example, the calibration is performed in response to a +20 millivolt (mV) test offset applied at the input to the buffers.

At the top of the figure, the offset calibration code 118 is represented as a code 304 value on the vertical axis. The offset calibration code 118 reflects the iterative adjustments made by the digital calibration FSM 236 to compensate for offset errors in the ADC circuit. As the calibration process progresses, the offset calibration code 118 may change in discrete steps. In the illustrated example, the offset calibration code 118 increases by a fixed positive amount at each fixed time step, linearly progressing from an initial value (e.g., code 304 value 4) to a final value (e.g., code 304 value 28).

At the bottom of the figure, the ADC code 312 is depicted on code axis 310. The ADC code 312 represents the digital output of the ADC (e.g., output signal 116 of FIG. 1) as the ADC responds to the input signals and the ongoing calibration process. In some examples, the ADC code 312 may converge towards a mid-scale value (e.g., 64 for a 7-bit ADC using 7-bit encodings) as the offset calibration process successfully compensates for errors.

The positive buffer output signal 224 and the negative buffer output signal 226 are depicted on voltage axis 306. These signals correspond to the outputs of the first buffer 202 and the second buffer 204, respectively, as shown in FIG. 2. The signals 224 and 226 may represent the differential analog input to the ADC after passing through the input buffers. In the illustrated example, the positive buffer output signal 224 stays largely constant (e.g., at around 311 mV), whereas the negative buffer output signal 226 rises closer to the voltage of the positive buffer output signal 224 (e.g., from about 295 mV to about 302 mV).

The positive buffer output reference 232 and the negative buffer output reference 234 are also shown on the voltage axis 306. These reference signals may be generated by the third buffer 206 and the fourth buffer 208, respectively, as illustrated in FIG. 2. They serve as comparison references for the comparator 222 of FIG. 2 during the ADC conversion process. In the illustrated example, the positive buffer output reference 232 and the negative buffer output reference 234 converge: the positive buffer output reference 232 falls in voltage (e.g., from about 326 mV to about 323 mV) whereas the negative buffer output reference 234 rises in voltage (e.g., from about 311 mV to about 318 mV).

The graph illustrates the dynamic interaction between the analog signals (buffer outputs and references) and the digital codes (offset calibration and ADC output) during the calibration process. As the offset calibration code 118 is adjusted, it may cause changes in the buffer output signals 224 and 226 through the action of the current steering DAC 214 (shown in FIG. 2).

In the illustrated example, the graph shows the convergence of the ADC code 312 towards a target value as the offset calibration progresses. This convergence indicates the effectiveness of the calibration process in compensating for offset errors.

The time course 300 may also reveal any glitches or transients in the buffer output signals that occur during updates to the offset calibration code 118. These glitches may be reduced or eliminated by the glitch suppression technique implemented in the current steering DAC, which uses a precharge signal to prepare the tail node of the single-ended unit current cells before switching.

The relationship between the offset calibration code 118 and the ADC code 312 demonstrates the iterative nature of the calibration process. As the offset calibration code 118 is adjusted, the ADC code 312 may respond, allowing the digital calibration FSM to make further refinements to achieve optimal offset compensation.

In some implementations, a graph such as that shown in FIG. 3 over a different time course could show multiple calibration cycles or responses to different input conditions, illustrating the ADC's ability to perform background calibration during mission mode operation. This capability allows the ADC to maintain accuracy over time and under varying operating conditions, such as temperature changes.

Figure 4:
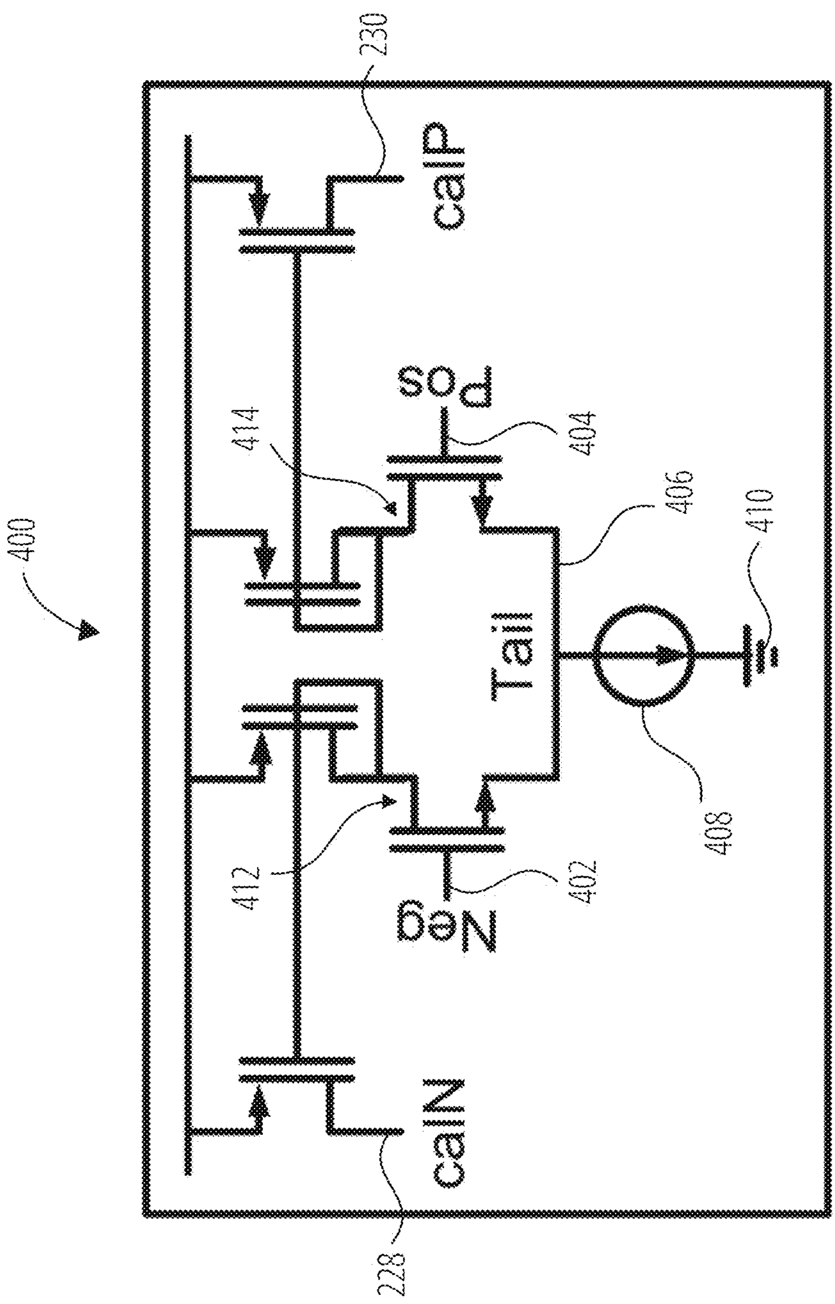
FIG. 4 is a circuit diagram illustrating a unit current cell in a current steering DAC, according to some examples.

FIG. 4 is a circuit diagram illustrating a first example of a unit current cell 400 in a current steering DAC. The unit current cell 400 represents a component of the current steering digital-to-analog converter (DAC) used in the offset calibration process of an ADC, such as a SAR ADC.

The illustrated unit current cell 400 has a single-ended architecture instead of differential architectures uses for some DACs. This single-ended architecture allows for independent control of positive and negative switches, enabling precise current steering for offset compensation. In contrast, a unit current cell having a differential architecture always maintains an open circuit path, resulting in a constant flow of current.

The negative switching signal 402 (Neg) and the positive switching signal 404 (Pos) serve as inputs to the unit current cell 400. These signals may be derived from or generated by the digital calibration finite state machine (FSM) 236, and they represent the calibration code used to adjust the bias currents within the source follower buffers of the ADC circuit.

The negative switching signal 402 and the positive switching signal 404 control the operation of the negative switch 412 and positive switch 414, respectively, within the unit current cell 400. These switches determine whether the calibration current is steered towards the negative or positive path. The independent control of these switches allows for flexible current steering configurations, which can enable precise offset calibration.

The tail signal 406 at the tail node (Tail) connects to the common source or emitter node of the switching transistors of the negative switch 412 and positive switch 414. The tail node is used by the glitch suppression technique implemented in the current steering DAC. In some examples, as described below with reference to FIG. 6, the tail signal 406 of the tail node may be precharged before switching operations in order to minimize transients and glitches in the output current.

The current source 408 generates the calibration current used for offset compensation. This current source 408 may be implemented using various circuit topologies, such as a simple transistor or a more complex current mirror configuration. The magnitude of the current generated by the current source 408 is fixed. Negative calibration signal 228 (calN) and positive calibration signal 230 (calP) are outputs shared by the multiple instances of the unit current cell 400. The amounts of the currents out of calP and calN depend on the number of unit cells turned on, which is controlled by the negative switching signal 402 and positive switching signal 404.

The ground 410 serves as the reference potential for the unit current cell 400. It provides a return path for the calibration current and ensures proper biasing of the circuit components.

In operation, the unit current cell 400 functions as follows. When the positive switching signal 404 is activated, the calibration current from the current source 408 is steered towards the positive calibration signal 230. Conversely, when the negative switching signal 402 is activated, the current is steered towards the negative calibration signal 228.

The single-ended architecture of the unit current cell 400 allows for situations where both the positive switch 414 and negative switch 412 are off simultaneously. This characteristic is leveraged in the glitch suppression technique described below with reference to FIG. 6, where a precharge signal is used to prepare the tail node before switching operations.

In some examples, the switches controlled by the negative switching signal 402 and the positive switching signal 404 may be operated in the saturation region. This operation mode helps to maintain a constant tail voltage of the tail signal 406, regardless of the drain voltage of the switches. Operating in the saturation region can contribute to reducing glitches during switching transitions.

In some examples, the unit current cell 400 can be replicated multiple times within the current steering DAC. In some examples, some of the cells are arranged in a thermometer-coded configuration and others in a binary-coded configuration. This hybrid approach may allow for a balance between precision and efficiency in the calibration process.

Figure 5:
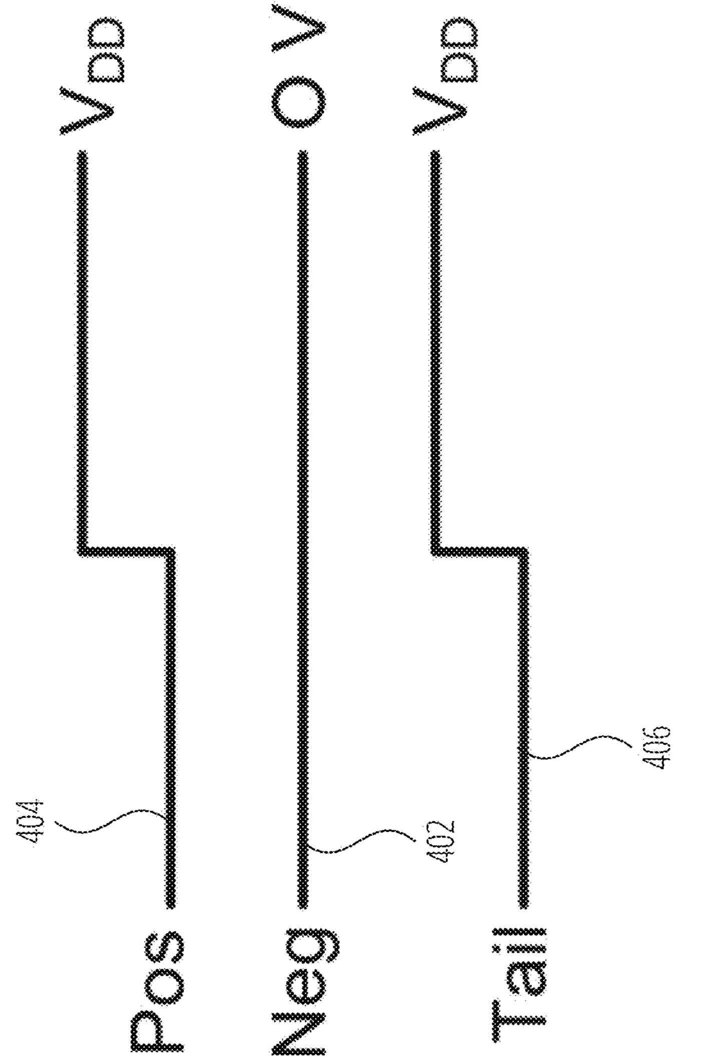
FIG. 5 is a timing diagram illustrating switching signals in a unit current cell, according to some examples.

FIG. 5 is a timing diagram illustrating switching signals in a unit current cell of a current steering DAC, such as unit current cell 400 of current steering DAC 214. The circuit diagram in FIG. 5 provides a detailed view of the switching mechanism within a single-ended unit current cell of the current steering DAC used in the offset calibration process of a SAR ADC. The single-ended configuration, as shown in FIG. 4, allows for independent control of the positive and negative current paths, enabling precise current steering for offset compensation.

The negative switching signal 402 controls the negative current path of the unit current cell. The negative current path may be implemented as a transistor switch, such as a MOSFET (Metal-Oxide-Semiconductor Field-Effect Transistor). When activated, the negative switching signal 402 closes the negative switch 412 of FIG. 4, allowing current to flow through the negative path of the current steering DAC.

The positive switching signal 404 controls the positive current path of the unit cell. Similar to the negative switch 412, the positive switch 414 of FIG. 4 closed by the positive switching signal 404 may also be implemented as a MOSFET. When activated, the positive switching signal 404 allows current to flow through the positive path of the current steering DAC.

The tail signal 406 represents the common source, emitter node, or tail node of the switching transistors, as shown in FIG. 4. The tail node is used in the operation of the unit current cell and is particularly important in the context of glitch suppression. The voltage level of the tail signal 406 affects the behavior of both the positive switch 414 and negative switch 412.

As described above with reference to FIG. 4, the unit current cell 400 operates as follows. When the positive switching signal 404 is high (voltage $V_{DD}$) and the negative switching signal 402 is low (voltage 0V), current flows through the positive path (e.g., positive switch 414). Conversely, when the negative switching signal 402 is high and the positive switching signal 404 is low, current flows through the negative path (e.g., negative switch 412).

The single-ended architecture of this switching configuration allows for a state where both the positive and negative switches are off simultaneously. In this state, the tail signal 406 may be pulled down to ground (voltage 0V). This characteristic is leveraged in the glitch suppression technique, where a precharge signal is used to prepare the tail node before switching operations.

Thus, in FIG. 5, on the left side (e.g., t=0) the voltages of the negative switching signal 402 and the positive switching signal 404 are low, such as 0V. This results in a low voltage (e.g., 0V) for the tail signal 406 as well. On the right side, the positive switching signal 404 has undergone a step increase to a high voltage ($V_{DD}$), resulting in a synchronous step increase of the tail signal 406 to a high voltage ($V_{DD}$). This illustrates a scenario in which the positive switch 414 and negative switch 412 are both turned off, and then the positive switch 414 is turned on. This scenario can give rise to glitches in some cases, as discussed in greater detail below.

Figure 6:
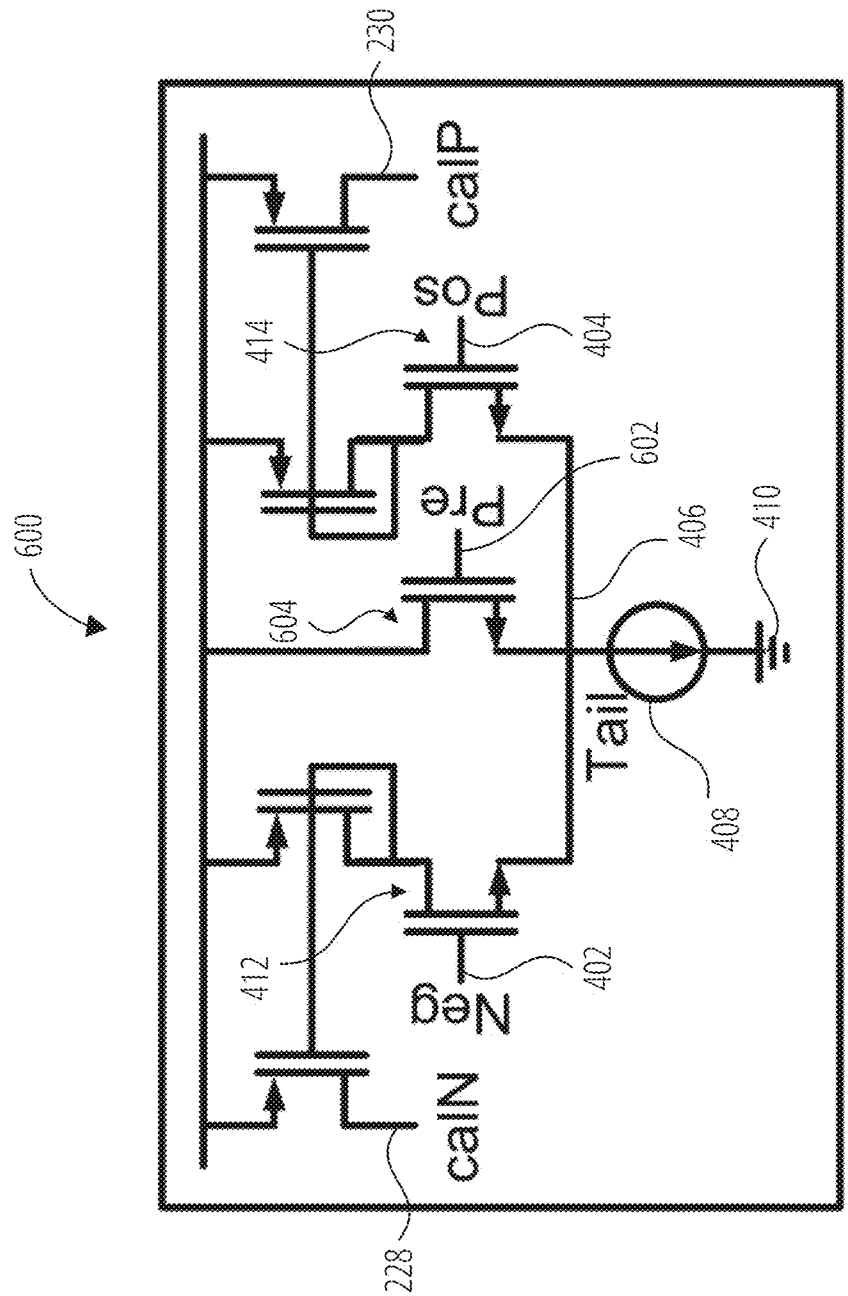
FIG. 6 is a circuit diagram illustrating a unit current cell with a precharge signal, according to some examples.

FIG. 6 is a circuit diagram illustrating a second example of a unit current cell 600 using a precharge signal 602. This example unit current cell 600 represents an enhanced version of the single-ended unit current cell of FIG. 4. In some examples, the unit current cell 600 can be used in the current steering digital-to-analog converter (DAC) for offset calibration in the SAR ADC.

This unit current cell 600 incorporates a precharge mechanism to address glitch-related issues during calibration updates. The negative calibration signal 228 and the positive calibration signal 230 serve as inputs to the unit current cell 600. The negative switching signal 402 and the positive switching signal 404 control the operation of the negative switch 412 and positive switch 414, respectively, within the unit current cell 600. These switches determine whether the calibration current is steered towards the negative or positive path. The independent control of these switches allows for flexible current steering configurations, which is used for precise offset calibration.

The tail signal 406 connects to the common source, emitter node, or tail node (Tail) of the switching transistors. This node plays a role in the glitch suppression technique implemented in the current steering DAC, as described below. The voltage level at the tail signal 406 affects the behavior of both the positive switch 414 and negative switch 412.

The current source 408 generates the calibration current used for offset compensation. The magnitude of this current may be determined by the calibration code (e.g., offset calibration code 118 of FIG. 3) provided by the digital calibration FSM.

The ground 410 serves as the reference potential for the unit current cell 600, providing a return path for the calibration current and ensuring proper biasing of the circuit components.

The precharge signal 602 is a new addition to the unit current cell 600 shown in FIG. 6, specifically introduced to implement a glitch suppression technique. The precharge signal 602 is used to precharge the tail node (tail signal 406) before switching operations occur.

In operation, the precharge signal 602 is activated before the positive switching signal 404 or negative switching signal 402 changes state. When activated, the precharge signal 602 closes the precharge switch 604, pulling the tail signal 406 to a predetermined voltage level, such as a voltage close to VDD minus the threshold voltage of the precharge transistor shown implementing the precharge switch 604 in FIG. 6. This precharging action prepares the tail node for the subsequent switching operation, minimizing or reducing the charge redistribution that occurs when the switches change state.

The precharge signal 602 may be generated based on an existing strobe signal used to update the calibration code. In some examples, the precharge signal 602 is only generated when transitioning from an off state to an on state in the unit current cell.

The incorporation of the precharge signal 602 allows the unit current cell 600 to suppress glitches caused by transients in the bias currents during calibration updates. This glitch suppression technique may provide a benefit when performing offset calibration during the ADC's mission mode, as it can help in maintaining signal integrity while allowing for dynamic compensation of offset drift over time.

In some examples, the switches 412 and 414 controlled by the negative switching signal 402 and the positive switching signal 404 may be operated in the saturation region. This operation mode helps maintain a constant tail voltage at the tail signal 406, regardless of the drain voltage of the switches, further contributing to glitch reduction during switching transitions.

In some examples, the unit current cell 600 with its precharge mechanism may be replicated multiple times within the current steering DAC. In some examples, some cells are arranged in a thermometer-coded configuration and others in a binary-coded configuration. This hybrid approach may enable a balance between precision and efficiency in the calibration process while maintaining the benefits of glitch suppression across all unit cells.

Figure 7:
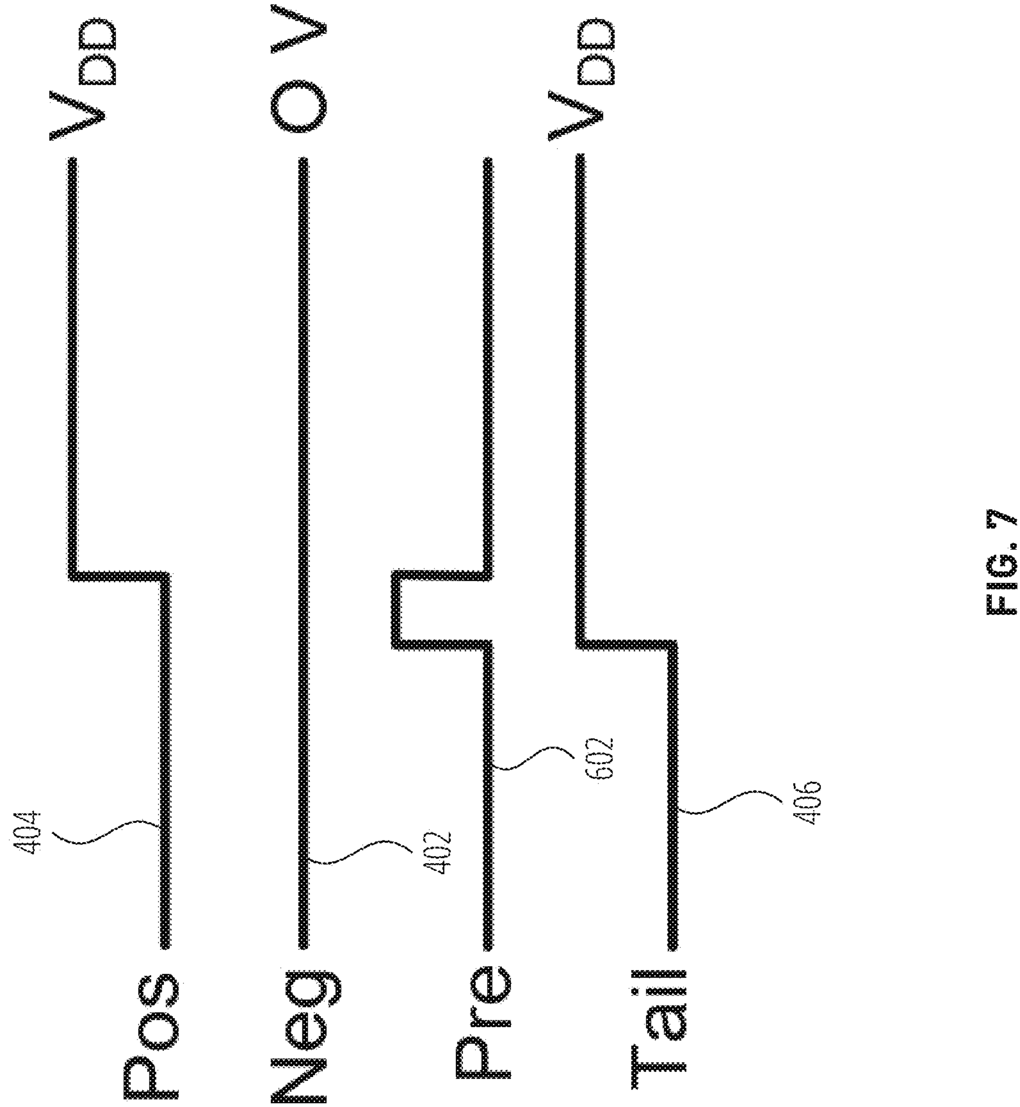
FIG. 7 is a timing diagram illustrating switching signals and a precharge signal in a unit current cell, according to some examples.

FIG. 7 is a timing diagram illustrating the signals of FIG. 5 with the addition of the precharge signal 602 (Pre) used in unit current cell 600. In FIG. 7, shortly before the positive switching signal 404 rises from 0V to $V_{DD}$, the precharge signal 602 rises in voltage to provide a precharge pulse, falling back to low voltage when the positive switching signal 404 rises in voltage. The period of this precharge pulse is referred to as the precharge period. As a result of the precharge signal 602 pulse, which closes the precharge switch 604 to allow current to flow, the tail signal 406 rises in voltage at the beginning of the precharge pulse instead of at the same time as the rise of the positive switching signal 404. Thus, the precharge signal 602 is used to precharge the tail node (tail signal 406) before the positive switch 414 is closed by the rising edge of the positive switching signal 404.

It will be appreciated that, in different cases, after the precharge operation, either the positive switching signal 404 or the negative switching signal 402 may be activated, depending on the desired current steering direction. When the positive switching signal 404 is high (VDD) and the negative switching signal 402 is low (0V), current flows through the positive path. Conversely, when the negative switching signal 402 is high and the positive switching signal 404 is low, current flows through the negative path. However, in some examples, the precharge signal 602 is only generated when transitioning from an off state to an on state in the unit current cell, which is determined by monitoring the previous and current states of the calibration process, as described below in reference to FIG. 8.

Figure 8:
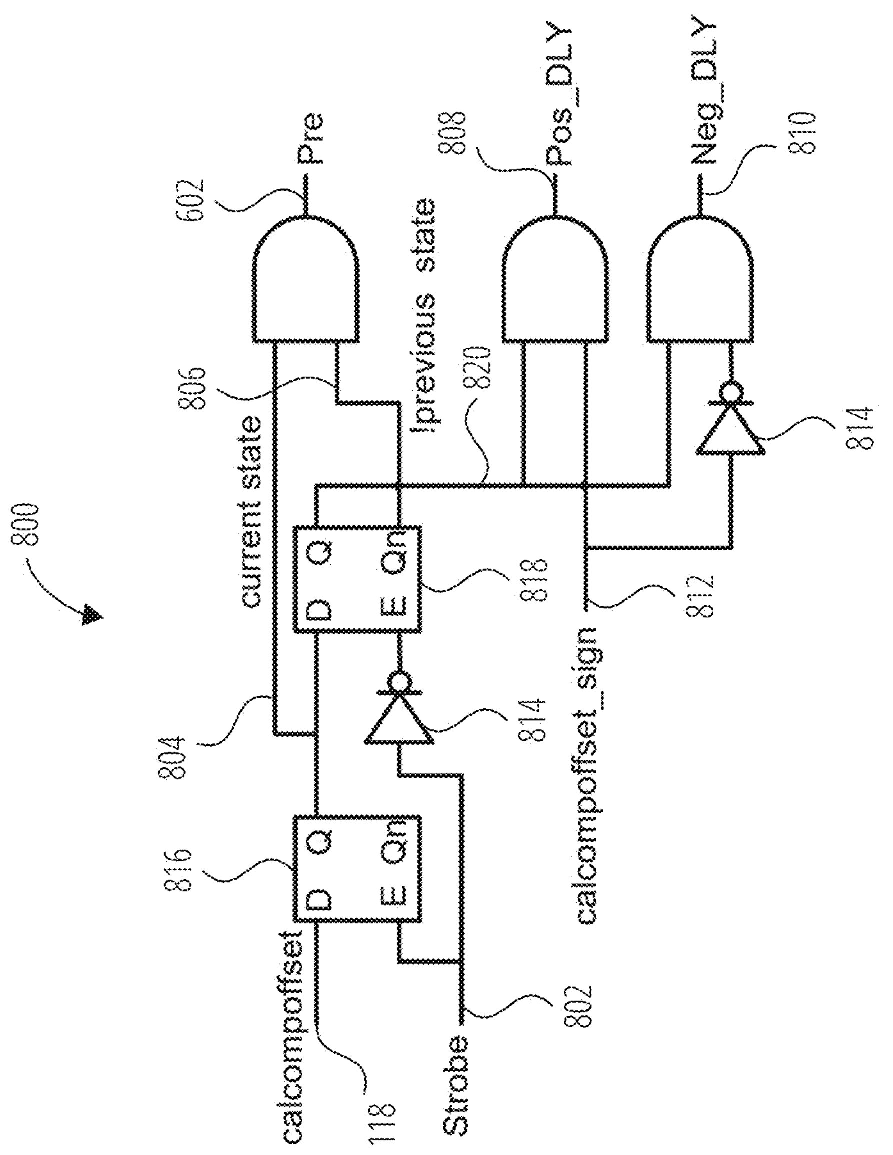
FIG. 8 is a block diagram illustrating a precharge signal generator, according to some examples.

FIG. 8 is a block diagram illustrating a precharge signal generator 800. The precharge signal generator 800 is used by the glitch suppression technique implemented in a current steering digital-to-analog converter (DAC) used for offset calibration in the SAR ADC. The precharge signal generator 800 generates the precharge signal 602 based on the current state of the calibration process and the value of a strobe signal 802 (Strobe) used to update the offset calibration code 118 (calcompoffset).

The offset calibration code 118 serves as an input to the precharge signal generator 800. This code represents the current calibration value determined by the digital calibration finite state machine (FSM) to compensate for offset errors in the ADC circuit. In some examples, the offset calibration code 118 is a multi-bit digital value, with its sign extracted and represented by the offset calibration code sign 812 (calcompoffset_sign). For example, the offset calibration code 118 can be a signed 7-bit code, resulting in a mid-code value of 64, as described above with reference to FIG. 3.

The strobe signal 802 is an existing signal in the ADC system used to update the offset calibration code 118. In this precharge signal generator 800, the existing strobe signal 802 is repurposed to trigger the generation of the precharge signal 602, eliminating the need for additional control signals.

A first latch 816 stores the value of a current state 804, updating when receiving a clock signal (in this case, strobe signal 802). A second latch 818 stores the value of a previous state, updating when it receives a delayed clock signal (in this case, the inverse of the strobe signal 802, after inversion by inverter 814). The second latch 818 outputs the previous state 820 as a first output, and the inverted previous state 806 as a second output. The current state 804 and the inverted previous state 806 are key inputs used to determine when the precharge signal 602 should be generated. In some examples, the latches 816 and 818 may be implemented as D flip-flops or other suitable storage elements.

The delayed positive switching signal 808 (Pos_DLY) and the delayed negative switching signal 810 (Neg_DLY) are derived from the positive switching signal 404 and negative switching signal 402, respectively, used in the unit current cells of the DAC (e.g., unit current cell 600). In the illustrated example, the delayed positive switching signal 808 is generated by an AND gate operating on the previous state 820 and the offset calibration code sign 812 signals, thereby generating a high-voltage output only when the previous state 820 is high and the offset calibration code sign 812 is high (e.g., indicating a positive sign). In the illustrated example, the delayed negative switching signal 810 is generated by an AND gate operating on the previous state 820 and an inverted (by inverter 814) version of the offset calibration code sign 812 signal, thereby generating a high-voltage output only when the previous state 820 is high and the offset calibration code sign 812 is low (indicating a negative sign). These delayed signals 808 and 810 ensure proper timing of the precharge operation (e.g., using precharge switch 604 of FIG. 6) relative to the switching of the current steering transistors of the unit current cell 600 (e.g., negative switch 412 and positive switch 414 of FIG. 6).

In operation, the precharge signal generator 800 only generates the precharge signal 602 when the previous state 820 is an off state (represented by a low previous state 820, and therefore a high inverted previous state 806) and the current state transitions to an on state (represented by the current state 804 being high). An AND gate can therefore be used to implement the logic to generate the precharge signal 602 from the current state 804 and inverted previous state 806. This condition ensures that the precharge operation occurs only when transitioning from an off state to an on state, minimizing unnecessary power consumption and potential disturbances to the ADC operation.

The precharge signal generator 800 may enable the implementation of the glitch suppression technique during the ADC's mission mode operation. By carefully timing the precharge signal 602 with respect to the switching operations, the precharge signal generator 800 can help to minimize transients and glitches in the output current when transitioning between different calibration states.

In some examples, the precharge signal generator 800 is replicated or modified to accommodate multiple unit current cells and/or different configurations of the current steering DAC. For example, in a hybrid thermometer-coded and binary-coded DAC architecture, the precharge signal generation logic may be adapted to handle the specific switching patterns of each coding scheme.

The design of the precharge signal generator 800 can facilitate efficient integration with the existing ADC calibration circuitry. By utilizing the strobe signal 802 and the offset calibration code 118, which are already present in the system, the precharge mechanism can be implemented with reduced additional overhead. This approach can result in background calibration and glitch suppression without significantly impacting the overall power consumption or area requirements of the ADC circuit (e.g., ADC 200 of FIG. 2).

Figure 9:
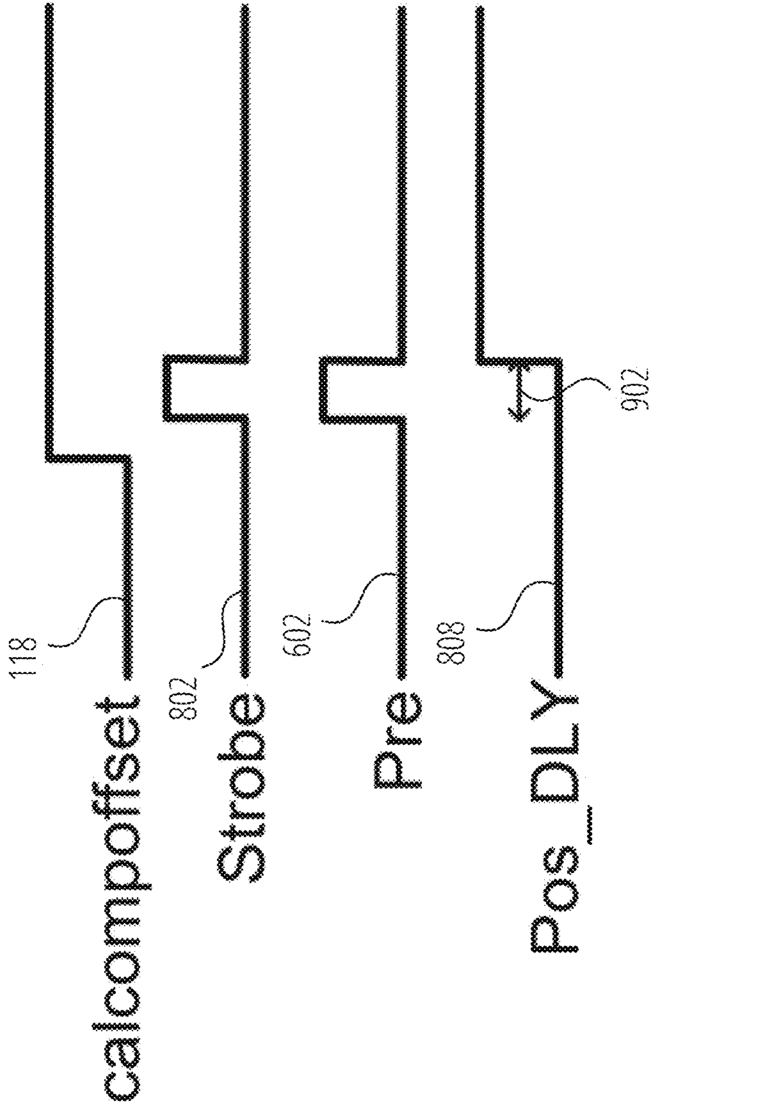
FIG. 9 is a timing diagram illustrating the generation of a precharge signal, according to some examples.

FIG. 9 is a timing diagram illustrating the generation of the precharge signal 602. The diagram depicts the temporal relationships between the offset calibration code 118, the strobe signal 802, the precharge signal 602, and the delayed positive switching signal 808.

The strobe signal 802 serves as a trigger for updating the offset calibration code 118 and initiating the precharge process. In some examples, the strobe signal 802 is an existing signal within the ADC circuit, repurposed by the unit current cell 600 of FIG. 6 for generating the precharge signal 602, thus eliminating the need for additional control signals.

The precharge signal 602 is generated based on the state transitions indicated by the offset calibration code 118 and triggered by the strobe signal 802. The precharge signal 602 is used to precharge the tail node of the single-ended unit current cell 600 in the current steering digital-to-analog converter (DAC) before turning on the positive switch 414. The precharge signal 602 is activated for a short duration, as indicated by the narrow pulse in the timing diagram.

The delayed positive switching signal 808 represents a delayed version of the control signal for the positive switch 414 in the single-ended unit current cell. This signal is delayed relative to the precharge signal 602, ensuring that the tail node has been properly precharged before the switching operation occurs.

The timing diagram shows a precharge period 902, which is the duration between the activation of the precharge signal 602 and the activation of the delayed positive switching signal 808. This period allows for the tail node to be fully precharged, effectively suppressing glitches that would otherwise occur due to sudden changes in bias currents during the offset calibration process.

In operation, after the offset calibration code 118 changes, indicating a transition from an off state to an on state, the strobe signal 802 triggers the generation of the precharge signal 602. As shown in FIG. 8, the precharge signal 602 is equal to (current state 804 AND inverted previous state 806=1 AND 1=1 after the state changes from 0 to 1). The precharge signal 602 activates briefly during the precharge period 902 to precharge the tail node of the single-ended unit current cell. After the precharge period 902, the delayed positive switching signal 808 activates (as shown in FIG. 9, the delayed positive switching signal 808 equals previous state 820 AND offset calibration code sign 812), turning on the positive switch 414 of the unit current cell 600. At the same time that the negative switch 412 closes, steering the current to the positive path, the strobe signal falls in voltage, thereby updating the second latch 818 (fed by the inverted strobe signal 802, such that the falling edge of the strobe signal 802 clocks the second latch 818 as a rising clock edge) to store the current state 804 (high, in this example). This triggers a change in the precharge signal 602 (equal to the high current state 804 AND the updated inverted second latch output, now low) to fall back to its low value.

It will be appreciated that, whereas the signal timings shown in FIG. 9 are described as being implemented by the precharge signal generator 800 of FIG. 8, other circuit implementations for these signal timings may be used in some examples.

The timing relationships shown in FIG. 9 facilitate the suppression of glitches caused by transients in the bias currents during the offset calibration process, thereby maintaining signal integrity during mission mode operation of the ADC circuit. Details of the signal effects of the precharge signal 602 timing are described below with reference to FIG. 10 and FIG. 11.

Figure 10:
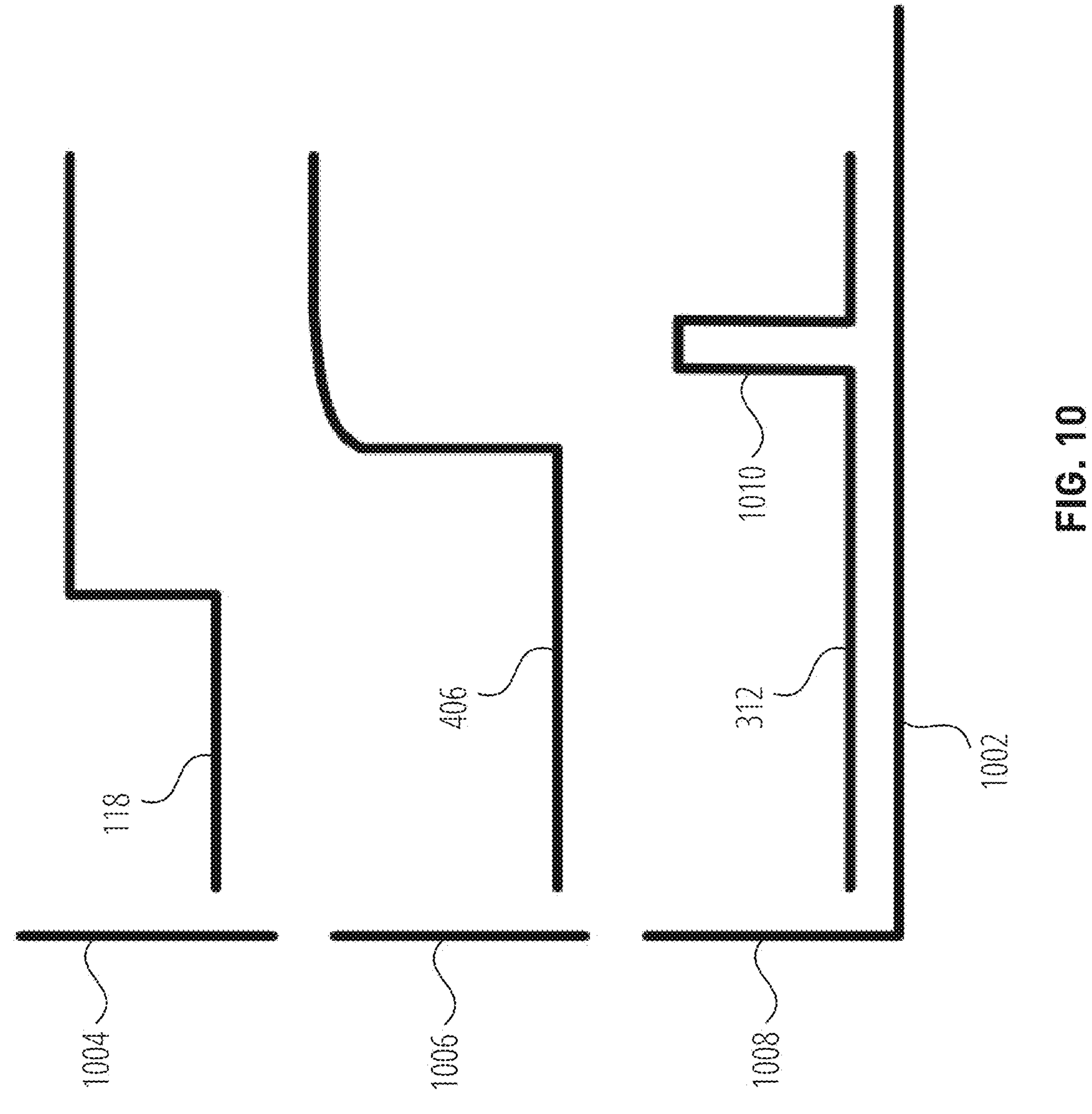
FIG. 10 is a graph illustrating glitches in an ADC output without glitch suppression, according to some examples.

FIG. 10 illustrates a timing diagram depicting the behavior of an ADC circuit (e.g., ADC 200 of FIG. 2) during an offset calibration process without glitch suppression. The diagram shows the temporal relationships between an offset calibration code 118, an ADC code 312, and a tail signal 406 over time 1002.

The offset calibration code 118, graphed as a code 1004 over time 1002, represents the digital value used to adjust the bias currents within the source follower buffers of the ADC circuit to compensate for offset errors. This code changes over time as the calibration process iteratively adjusts the bias currents during mission mode operation, as described above.

The ADC code 312, graphed as a code 1008 over time 1002, represents the digital output of the ADC circuit, which corresponds to the analog input signal being converted (e.g., input signal 102 of FIG. 1 or differential positive input voltage 210 and negative input voltage 212 of FIG. 2). In an ideal scenario, the ADC code 312 should remain stable during the calibration process. However, the diagram shows a fluctuation in the ADC code 312, indicating the presence of glitches during the calibration process.

The tail signal 406, graphed as a voltage 1006 over time 1002, represents the voltage at the tail node of a single-ended unit current cell (e.g., unit current cell 600) in the current steering digital-to-analog converter (DAC). This signal can be the source of glitches in the ADC output.

The diagram illustrates a transition in the offset calibration code 118 from a low value to a high value, represented by the step change in the code 1004. This transition corresponds to an update in the calibration settings of the ADC circuit.

Coinciding with the change in the offset calibration code 118, the tail signal 406 exhibits a sudden voltage change. This abrupt change in the tail node voltage results from the switching of current cells in the DAC without precharging.

The sudden change in the tail signal 406 propagates through the ADC circuit, causing a glitch 1010 in the ADC code 312. This glitch represents an undesired fluctuation in the digital output of the ADC, which may lead to errors in the converted digital signal. The glitch 1010 in the ADC code 312 demonstrates the impact of sudden changes in bias currents during the offset calibration process. These glitches may occur when transitioning from an off state to an on state in the single-ended unit current cells of the current steering DAC. In some examples, the magnitude and duration of the glitch 1010 may vary depending on factors such as the specific ADC architecture, the magnitude of the change in the offset calibration code 118, and the characteristics of the current steering DAC.

The timing relationships shown in FIG. 10 highlight the need for glitch suppression techniques during the offset calibration process to maintain signal integrity and accuracy in the ADC output. These glitches may particularly affect the ADC performance when calibration is performed during mission mode operation, potentially introducing errors in the converted digital signal.

Figure 11:
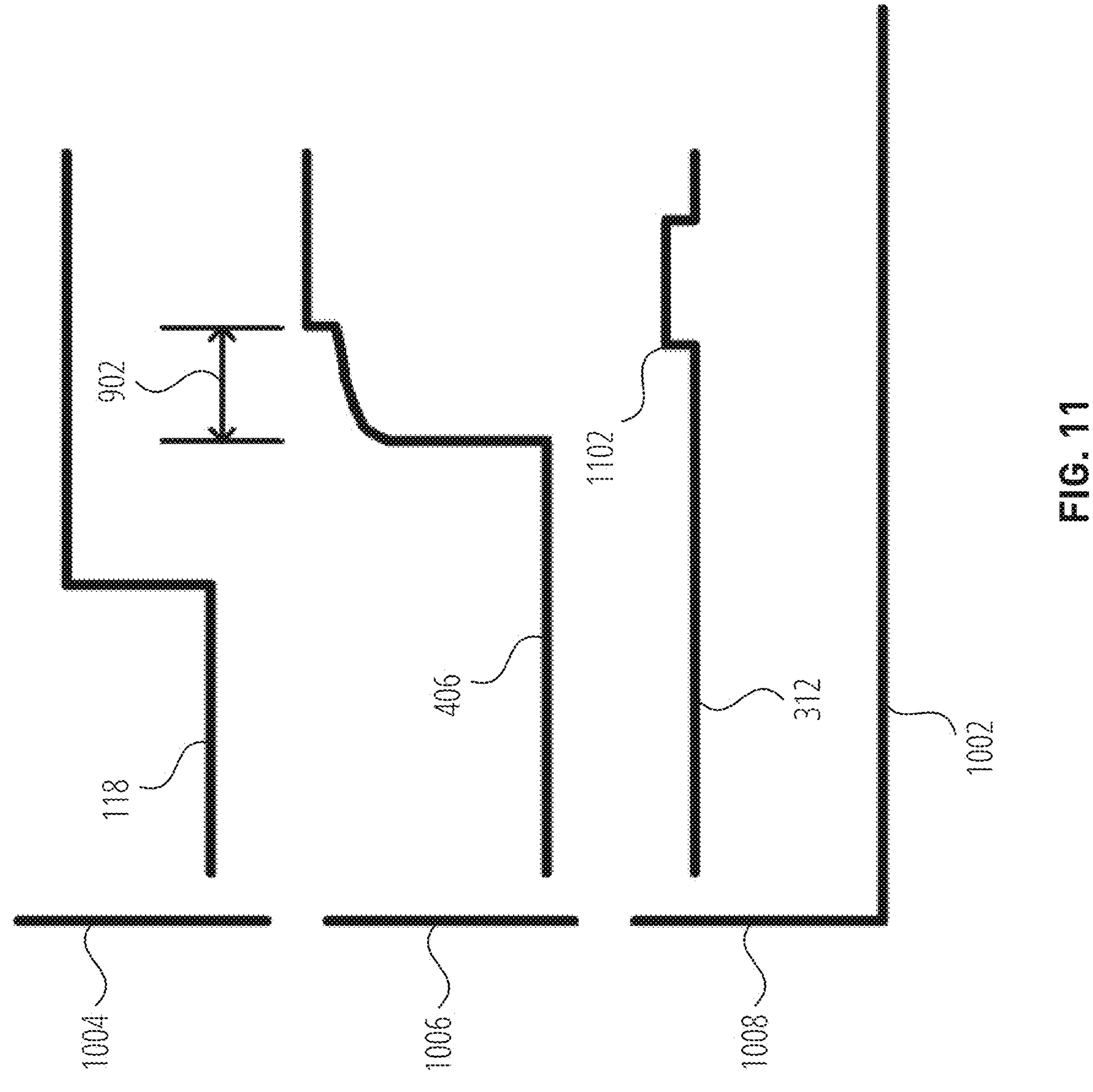
FIG. 11 is a graph illustrating reduced glitches in an ADC output with glitch suppression, according to some examples.

FIG. 11 illustrates a timing diagram depicting the behavior of an analog-to-digital converter (ADC) circuit during an offset calibration process with glitch suppression. The diagram shows the temporal relationships between the same signals as FIG. 10, graphed on the same axes.

In this diagram, after the offset calibration code 118 increases, the strobe signal 802 of FIG. 8 is used to generate the precharge signal 602 of FIG. 6, causing the precharge switch 604 of FIG. 6 to turn on, precharging the tail node over the precharge period 902. After the precharge period 902, the positive switch 414 is turned on and the precharge switch 604 is turned off. However, because the tail node has been precharged (as shown by the controlled voltage increase of the tail signal 406 over the precharge period 902 in FIG. 9), the tail signal 406 settles to its new voltage level without the abrupt change seen in FIG. 10. This controlled transition is achieved by using the precharge signal 602 to precharge the tail node of the single-ended unit current cell 600 before turning on the positive switch 414.

The ADC code 312 thus remains relatively stable throughout the calibration process, demonstrating the effectiveness of the glitch suppression technique. Instead of a large glitch 1010 as shown in FIG. 10, the ADC code 312 in FIG. 11 exhibits a much smaller glitch 1102 (shown as approximately 1/7 the magnitude of glitch 1010). In some examples, this small glitch 1102 is insufficient to disrupt the digital output of the ADC. Thus, by precharging the tail node before switching operations, some examples are able to maintain signal integrity and accuracy in the ADC output, even when calibration is performed during mission mode operation.

This glitch suppression technique may be particularly beneficial in high-speed serializer/deserializer (SerDes) systems using PAM4 signaling, where multiple interleaved SAR ADCs are employed to achieve high data rates while maintaining low power consumption. In some examples, the glitch suppression technique allows for background offset calibration to correct for offset drift without affecting signal integrity during mission mode.

Figure 12:
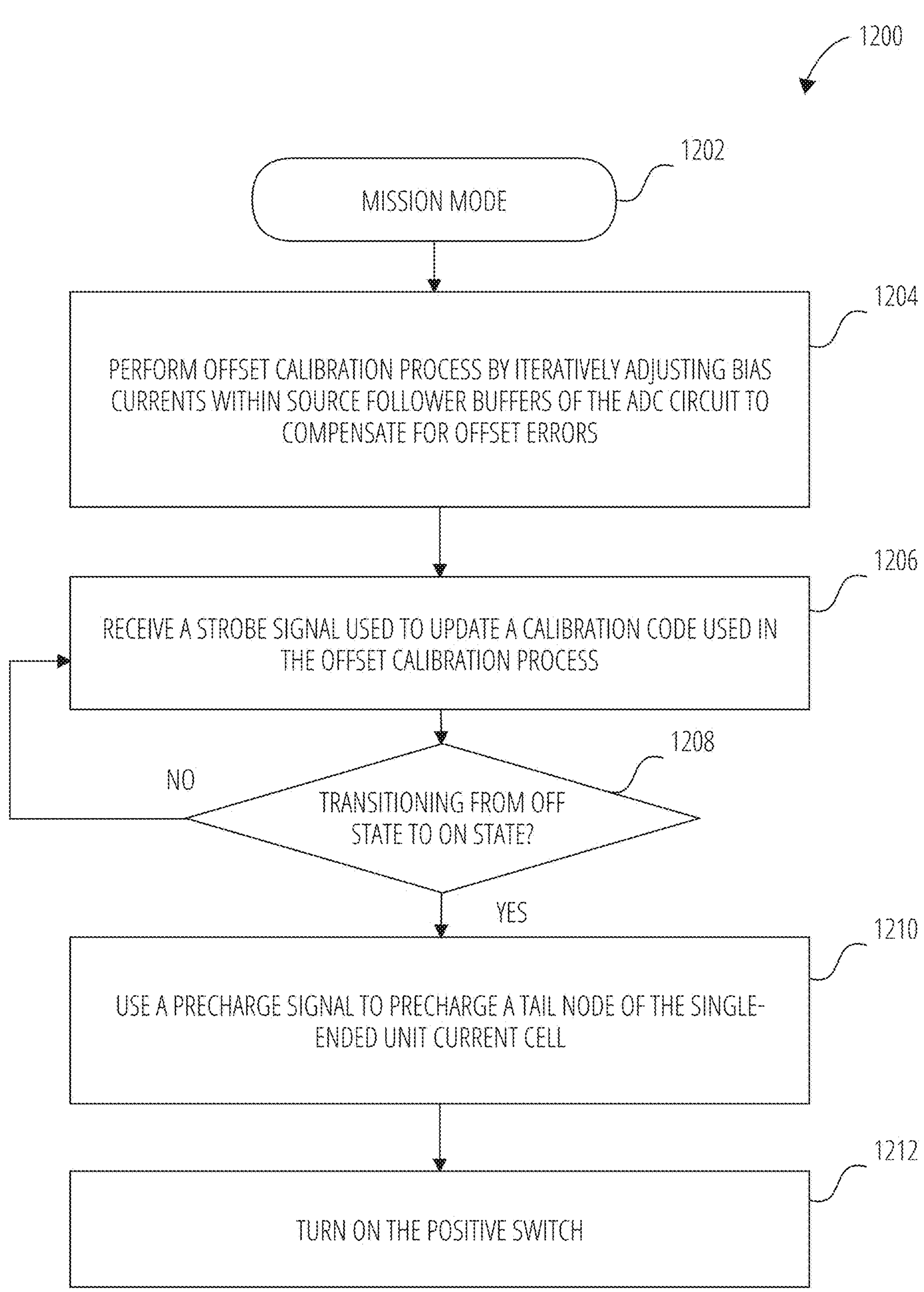
FIG. 12 is a flowchart illustrating a method for suppressing glitches during offset calibration in an ADC circuit, according to some examples.

FIG. 12 illustrates an example method 1200 for suppressing glitches in an analog-to-digital converter (ADC) circuit during an offset calibration process. Whereas the method 1200 is described with reference to the various circuits described herein, it will be appreciated that some examples may implement method 1200 using different configurations of ADC circuits and sub-circuits.

Although the example method 1200 depicts a particular sequence of operations, the sequence may be altered without departing from the scope of the present disclosure. For example, some of the operations depicted may be performed in parallel or in a different sequence that does not materially affect the function of the method 1200. In other examples, different components of an example device or system that implements the method 1200 may perform functions at substantially the same time or in a specific sequence.

According to some examples, the method 1200 includes operating in mission mode at operation 1202. As described above, mission mode is an operational mode in which the ADC is functioning to generate digital outputs from analog inputs as part of the functional operation of a larger system. Mission mode is therefore defined in contrast to a dedicated calibration or testing mode in which the outputs are not used for the operation of the larger system.

According to some examples, the method 1200 includes performing an offset calibration process by iteratively adjusting bias currents within source follower buffers of the ADC circuit to compensate for offset errors at operation 1204. In some examples, the offset calibration process is the iterative, successive approximation calibration process described above with reference to SAR ADCs using a digital calibration finite state machine.

According to some examples, the method 1200 includes receiving a strobe signal 802 used to update a calibration code (e.g., offset calibration code 118) used in the offset calibration process at operation 1206. In some examples, the strobe signal 802 can be a pre-existing signal used to update the offset calibration code 118, as described above. The strobe signal 802 can be received by the precharge signal generator 800, as shown in FIG. 8.

According to some examples, the method 1200 includes transitioning from an off state to an on state at operation 1208. As described above, in some examples, the precharge operation is only triggered when the unit current cell 600 is transitioning from an off state to an on state, according to the precharge signal generator 800 logic of FIG. 8.

According to some examples, the method 1200 includes using a precharge signal 602 to precharge a tail node of the single-ended unit current cell 600 at operation 1210. The precharging of the tail node is described above in reference to FIG. 6 through FIG. 9 and FIG. 11.

According to some examples, the method 1200 includes turning on the positive switch 414 at operation 1212. As described above, the delayed positive switching signal 808 switches the positive switch 414 at the end of the precharge period 902, steering the (precharged) current toward the positive path of the unit current cell 600.

An example machine architecture will now be described, providing examples suitable for implementing one or more of the operations of the method 1200 described above as instructions executed by one or more processors of a system, such as the machine described with reference to FIG. 13. In some examples, one or more of the signals described above can be generated by firmware or other software instructions executed by a machine, as described below.

Figure 13:
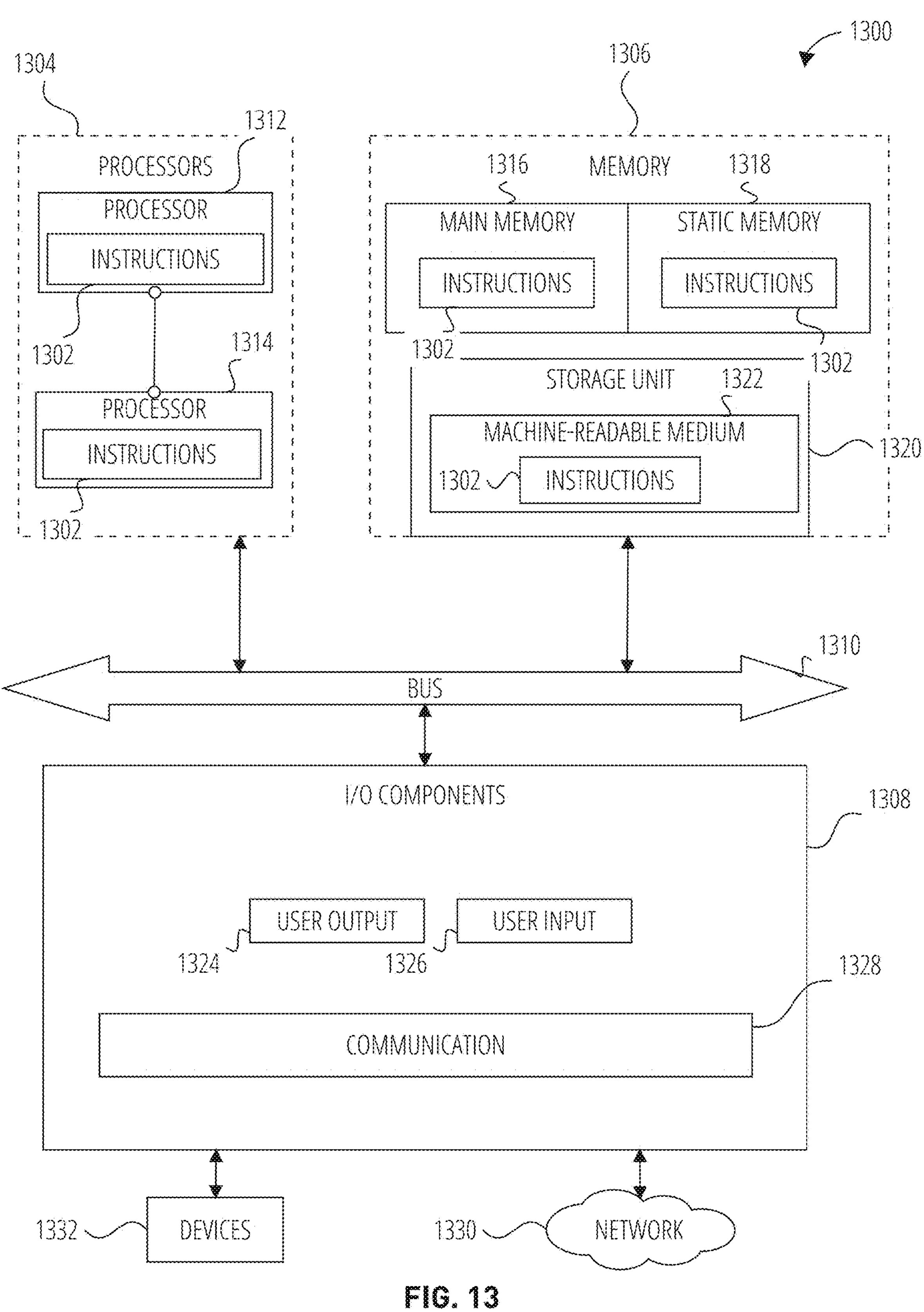
FIG. 13 is a diagrammatic representation of a machine in the form of a computer system within which a set of instructions may be executed to cause the machine to perform any one or more of the methodologies discussed herein, according to some examples.

FIG. 13 is a diagrammatic representation of the machine 1300 within which instructions 1302 (e.g., software, a program, an application, an applet, an app, or other executable code) for causing the machine 1300 to perform any one or more of the methodologies discussed herein may be executed. For example, the instructions 1302 may cause the machine 1300 to execute any one or more operations of the methods described herein, and/or to implement one or more components or functions of the systems described herein. The instructions 1302 transform the general, non-programmed machine 1300 into a particular machine 1300 programmed to carry out the described and illustrated functions in the manner described. The machine 1300 may operate as a standalone device or may be coupled (e.g., networked) to other machines. In a networked deployment, the machine 1300 may operate in the capacity of a server machine or a client machine in a server-client network environment, or as a peer machine in a peer-to-peer (or distributed) network environment. The machine 1300 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 1302, sequentially or otherwise, that specify actions to be taken by the machine 1300. Further, while a single machine 1300 is illustrated, the term "machine" shall also be taken to include a collection of machines that individually or jointly execute the instructions 1302 to perform any one or more of the methodologies discussed herein. In some examples, the machine 1300 may comprise both client and server systems, with certain operations of a particular method or algorithm being performed on the server-side and with certain operations of the particular method or algorithm being performed on the client-side.

The machine 1300 may include processors 1304, memory 1306, and input/output I/O components 1308, which may be configured to communicate with each other via a bus 1310. In an example, the processors 1304 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 1312 and a processor 1314 that execute the instructions 1302. The term "processor" is intended to include multi-core processors that may comprise two or more independent processors (sometimes referred to as "cores") that may execute instructions contemporaneously. Although FIG. 13 shows multiple processors 1304, the machine 1300 may include a single processor with a single-core, a single processor with multiple cores (e.g., a multi-core processor), multiple processors with a single core, multiple processors with multiples cores, or any combination thereof.

The memory 1306 includes a main memory 1316, a static memory 1318, and a storage unit 1320, both accessible to the processors 1304 via the bus 1310. The main memory 1306, the static memory 1318, and storage unit 1320 store the instructions 1302 embodying any one or more of the methodologies or functions described herein. The instructions 1302 may also reside, completely or partially, within the main memory 1316, within the static memory 1318, within machine-readable medium 1322 within the storage unit 1320, within at least one of the processors 1304 (e.g., within the processor's cache memory), or any suitable combination thereof, during execution thereof by the machine 1300.

The I/O components 1308 may include a wide variety of components to receive input, provide output, produce output, transmit information, exchange information, capture measurements, and so on. The specific I/O components 1308 that are included in a particular machine will depend on the type of machine. For example, portable machines such as mobile phones may include a touch input device or other such input mechanisms, while a headless server machine will likely not include such a touch input device. It will be appreciated that the I/O components 1308 may include many other components that are not shown in FIG. 13. In various examples, the I/O components 1308 may include user output components 1324 and user input components 1326. The user output components 1324 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 1326 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 1308 further include communication components 1328 operable to couple the machine 1300 to a network 1330 or devices 1332 via respective coupling or connections. For example, the communication components 1328 may include a network interface component or another suitable device to interface with the network 1330. In further examples, the communication components 1328 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1332 may be another machine or any of a wide variety of peripheral devices (e.g., a peripheral device coupled via a USB).

Moreover, the communication components 1328 may detect identifiers or include components operable to detect identifiers. For example, the communication components 1328 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 1328, such as location via Internet Protocol (IP) geolocation, location via Wi-Fi® signal triangulation, location via detecting an NFC beacon signal that may indicate a particular location, and so forth.

The various memories (e.g., main memory 1316, static memory 1318, and memory of the processors 1304) and storage unit 1320 may store one or more sets of instructions and data structures (e.g., software) embodying or used by any one or more of the methodologies or functions described herein. These instructions (e.g., the instructions 1302), when executed by processors 1304, cause various operations to implement the disclosed examples.

The instructions 1302 may be transmitted or received over the network 1330, using a transmission medium, via a network interface device (e.g., a network interface component included in the communication components 1328) and using any one of several well-known transfer protocols (e.g., hypertext transfer protocol (HTTP)). Similarly, the instructions 1302 may be transmitted or received using a transmission medium via a coupling (e.g., a peer-to-peer coupling) to the devices 1332.

The incorporation of the unit current cell 600 of FIG. 6 and the precharge signal generator 800 of FIG. 8 into the ADC 200 of FIG. 2 results in an ADC configured to perform glitch reduction during offset calibration or recalibration. In some examples, the ADC can thereby perform offset calibration during mission mode without increasing power consumption substantially and without disrupting signal integrity.

Thus, some examples provide an analog-to-digital converter (ADC) circuit. The ADC circuit has one or more source follower buffers (such as 202, 204, 206, and 208) to receive an analog input signal (such as a differential signal derived from positive input voltage 210 and negative input voltage 212). The ADC circuit has a comparator 222 to process outputs of the one or more source follower buffers. The ADC circuit also includes a digital calibration finite state machine (SAR FSM 218) to receive an output of the source follower buffers and perform an offset calibration process during mission mode by iteratively adjusting bias currents within the at least one of the source follower buffers to compensate for offset errors. The ADC circuit has a precharge signal generator 800 to receive a strobe signal 802 used to update an offset calibration code 118 of the offset calibration process, and generate a precharge signal 602 based on the strobe signal 802. The ADC circuit also includes a current steering digital-to-analog converter (current steering DAC 214), including a single-ended unit current cell 600 having a positive switch 414 and a negative switch 412 that are independently controllable. In response to transitioning from an off state to an on state, the unit current cell 600 uses the precharge signal 602 to precharge a tail node (corresponding to tail signal 406) of the single-ended unit current cell 600 before turning on the positive switch 414, thereby suppressing glitches caused by transients in the bias currents of the source follower buffers.

Specific examples are now described.

Example 1 is an analog-to-digital converter (ADC) circuit, comprising: a digital calibration finite state machine (FSM) to perform an offset calibration process during mission mode by iteratively adjusting bias currents within source follower buffers of the ADC circuit to compensate for offset errors; and a current steering digital-to-analog converter (DAC), comprising a single-ended unit current cell comprising a positive switch and a negative switch that are independently controllable, to: receive a strobe signal used to update a calibration code of the offset calibration process; and in response to transitioning from an off state to an on state, use a precharge signal based on the strobe signal to precharge a tail node of the single-ended unit current cell before turning on the positive switch, thereby suppressing glitches caused by transients in the bias currents.

In Example 2, the subject matter of Example 1 includes, wherein: the single-ended unit current cell generates the precharge signal based on the strobe signal.

In Example 3, the subject matter of Example 2 includes, wherein: the precharge signal is generated only when a previous state of the single-ended unit current cell is the off state and a current state becomes the on state.

In Example 4, the subject matter of Example 3 includes, wherein: the single-ended unit current cell comprises: a previous state latch to define the previous state; and a current state latch to define the current state.

In Example 5, the subject matter of Examples 1~4 includes, wherein: the ADC circuit comprises a Successive Approximation Register (SAR) ADC.

In Example 6, the subject matter of Examples 1-5 includes, wherein: the offset calibration process comprises recalibration during mission mode to correct for offset drift.

In Example 7, the subject matter of Example 6 includes, wherein: the digital calibration FSM performs the recalibration in response to detection of a temperature change in the ADC circuit.

In Example 8, the subject matter of Examples 6-7 includes, wherein: the offset calibration process does not affect signal integrity during mission mode.

In Example 9, the subject matter of Examples 1-8 includes, wherein: the positive switch and negative switch of the single-ended unit current cell are operated in a saturation region to maintain a constant tail voltage of the tail node independently of a drain voltage.

In Example 10, the subject matter of Examples 1-9 includes, wherein: the current steering DAC comprises a plurality of single-ended unit current cells arranged in a thermometer-coded configuration and a binary-coded configuration, the plurality of single-ended unit current cells comprising the single-ended unit current cell.

Example 11 is a method for suppressing glitches in an analog-to-digital converter (ADC) circuit during an offset calibration process, comprising: performing the offset calibration process during mission mode by iteratively adjusting bias currents within source follower buffers of the ADC circuit to compensate for offset errors; receiving, at a current steering digital-to-analog converter (DAC) comprising a single-ended unit current cell comprising a positive switch and a negative switch that are independently controllable, a strobe signal used to update a calibration code of the offset calibration process; and in response to transitioning from an off state to an on state, using a precharge signal based on the strobe signal to precharge a tail node of the single-ended unit current cell before turning on the positive switch, thereby suppressing glitches caused by transients in the bias currents.

In Example 12, the subject matter of Example 11 includes, generating the precharge signal based on the strobe signal.

In Example 13, the subject matter of Example 12 includes, wherein: the precharge signal is generated only when a previous state of the single-ended unit current cell is the off state and a current state becomes the on state.

In Example 14, the subject matter of Example 13 includes, wherein: the single-ended unit current cell comprises: a previous state latch to define the previous state; and a current state latch to define the current state.

In Example 15, the subject matter of Examples 11-14 includes, wherein: the ADC circuit comprises a Successive Approximation Register (SAR) ADC.

In Example 16, the subject matter of Examples 11-15 includes, wherein: the offset calibration process comprises recalibration during mission mode to correct for offset drift.

In Example 17, the subject matter of Example 16 includes, wherein: the recalibration is performed in response to detection of a temperature change in the ADC circuit.

In Example 18, the subject matter of Examples 16-17 includes, wherein: the offset calibration process does not affect signal integrity during mission mode.

In Example 19, the subject matter of Examples 11-18 includes, operating the positive switch and negative switch of the single-ended unit current cell in a saturation region to maintain a constant tail voltage of the tail node independently of a drain voltage.

Example 20 is an analog-to-digital converter (ADC) circuit, comprising: one or more source follower buffers to receive an analog input signal; a comparator to process outputs of the one or more source follower buffers; a digital calibration finite state machine (FSM) to receive an output of the one or more source follower buffers and perform an offset calibration process during mission mode by iteratively adjusting bias currents within the at least one of the one or more source follower buffers to compensate for offset errors; a precharge signal generator to: receive a strobe signal used to update a calibration code of the offset calibration process; and generate a precharge signal based on the strobe signal; and a current steering digital-to-analog converter (DAC), comprising a single-ended unit current cell comprising a positive switch and a negative switch that are independently controllable, to: in response to transitioning from an off state to an on state, use the precharge signal to precharge a tail node of the single-ended unit current cell before turning on the positive switch, thereby suppressing glitches caused by transients in the bias currents.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms “a” or “an” are used, as is common in patent documents, to include one or more than one, independent of any other instances or usages of “at least one” or “one or more.” In this document, the term “or” is used to refer to a nonexclusive or, such that “A or B” includes “A but not B,” “B but not A,” and “A and B,” unless otherwise indicated. In the appended claims, the terms “including” and “in which” are used as the plain-English equivalents of the respective terms “comprising” and “wherein.” Also, in the following claims, the terms “including” and “comprising” are open-ended; that is, a system, device, article, or process that includes elements in addition to those listed after such a term in a claim is still deemed to fall within the scope of that claim.

“Component” refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A “hardware component” is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase “hardware component” (or “hardware-implemented component”) should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, “processor-implemented component” refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a “cloud computing” environment or as a “software as a service” (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

What is claimed is:

1. An analog-to-digital converter (ADC) circuit, comprising:

a digital calibration finite state machine (FSM) to perform an offset calibration process during mission mode by iteratively adjusting bias currents within source follower buffers of the ADC circuit to compensate for offset errors; and a current steering digital-to-analog converter (DAC), comprising a single-ended unit current cell comprising a positive switch and a negative switch that are independently controllable, to:

receive a strobe signal used to update a calibration code of the offset calibration process; and in response to transitioning from an off state to an on state, use a precharge signal based on the strobe signal to precharge a tail node of the single-ended unit current cell before turning on the positive switch, thereby suppressing glitches caused by transients in the bias currents.

2. The ADC circuit of claim 1, wherein:

the single-ended unit current cell generates the precharge signal based on the strobe signal.

3. The ADC circuit of claim 2, wherein:

the precharge signal is generated only when a previous state of the single-ended unit current cell is the off state and a current state becomes the on state.

4. The ADC circuit of claim 3, wherein:

the single-ended unit current cell comprises:

a previous state latch to define the previous state; and a current state latch to define the current state.

5. The ADC circuit of claim 1, wherein:

the ADC circuit comprises a Successive Approximation Register (SAR) ADC.

6. The ADC circuit of claim 1, wherein:

the offset calibration process comprises recalibration during mission mode to correct for offset drift.

7. The ADC circuit of claim 6, wherein:

the digital calibration FSM performs the recalibration in response to detection of a temperature change in the ADC circuit.

8. The ADC circuit of claim 6, wherein:

the offset calibration process does not affect signal integrity during mission mode.

9. The ADC circuit of claim 1, wherein:

the positive switch and negative switch of the single-ended unit current cell are operated in a saturation region to maintain a constant tail voltage of the tail node independently of a drain voltage.

10. The ADC circuit of claim 1, wherein:

the current steering DAC comprises a plurality of single-ended unit current cells arranged in a thermometer-coded configuration and a binary-coded configuration, the plurality of single-ended unit current cells comprising the single-ended unit current cell.

11. A method for suppressing glitches in an analog-to-digital converter (ADC) circuit during an offset calibration process, comprising:

performing the offset calibration process during mission mode by iteratively adjusting bias currents within source follower buffers of the ADC circuit to compensate for offset errors;

receiving, at a current steering digital-to-analog converter (DAC) comprising a single-ended unit current cell comprising a positive switch and a negative switch that are independently controllable, a strobe signal used to update a calibration code of the offset calibration process; and in response to transitioning from an off state to an on state, using a precharge signal based on the strobe signal to precharge a tail node of the single-ended unit current cell before turning on the positive switch, thereby suppressing glitches caused by transients in the bias currents.

12. The method of claim 11, further comprising:

generating the precharge signal based on the strobe signal.

13. The method of claim 12, wherein:

the precharge signal is generated only when a previous state of the single-ended unit current cell is the off state and a current state becomes the on state.

14. The method of claim 13, wherein:

the single-ended unit current cell comprises:

a previous state latch to define the previous state; and a current state latch to define the current state.

15. The method of claim 11, wherein:

the ADC circuit comprises a Successive Approximation Register (SAR) ADC.

16. The method of claim 11, wherein:

the offset calibration process comprises recalibration during mission mode to correct for offset drift.

17. The method of claim 16, wherein:

the recalibration is performed in response to detection of a temperature change in the ADC circuit.

18. The method of claim 16, wherein:

the offset calibration process does not affect signal integrity during mission mode.

19. The method of claim 11, further comprising:

operating the positive switch and negative switch of the single-ended unit current cell in a saturation region to maintain a constant tail voltage of the tail node independently of a drain voltage.

20. An analog-to-digital converter (ADC) circuit, comprising:

one or more source follower buffers to receive an analog input signal;

a comparator to process outputs of the one or more source follower buffers;

a digital calibration finite state machine (FSM) to receive an output of the one or more source follower buffers and perform an offset calibration process during mission mode by iteratively adjusting bias currents within the at least one of the one or more source follower buffers to compensate for offset errors;

a precharge signal generator to:

receive a strobe signal used to update a calibration code of the offset calibration process; and generate a precharge signal based on the strobe signal; and a current steering digital-to-analog converter (DAC), comprising a single-ended unit current cell comprising a positive switch and a negative switch that are independently controllable, to:

in response to transitioning from an off state to an on state, use the precharge signal to precharge a tail node of the single-ended unit current cell before turning on the positive switch, thereby suppressing glitches caused by transients in the bias currents.

* * * * *